United States Patent
Olita

[11] 4,024,413
[45] May 17, 1977

[54] SENSALIGHT

[76] Inventor: Stephen Gregory Olita, 4134 Friendship Lane, Memphis, Tenn. 38138

[22] Filed: Nov. 17, 1975

[21] Appl. No.: 632,524

[52] U.S. Cl. .......................... 307/117; 340/258 R
[51] Int. Cl.² ....................................... H01H 37/00
[58] Field of Search .......................... 307/117, 116; 317/DIG. 2, 146; 340/258 R, 258 A, 258 B, 258 C; 240/2-13

[56] References Cited
UNITED STATES PATENTS

| | | | |
|---|---|---|---|
| 3,471,846 | 10/1969 | Cotter et al. | 340/258 R |
| 3,582,671 | 6/1971 | Ott | 307/117 |

*Primary Examiner*—Herman J. Hohauser

[57] ABSTRACT

An electric circuit which is activated from the sound waves produced by jingling of keys, such as when a person wishes to unlock a door so to enter his home, the activated circuit turning on a porch lamp light and the like; the circuit including a transducer mounted next to a doorbell, the transducer changing all frequencies into electrical pulses, the pulses being amplified by three stages.

1 Claim, 1 Drawing Figure

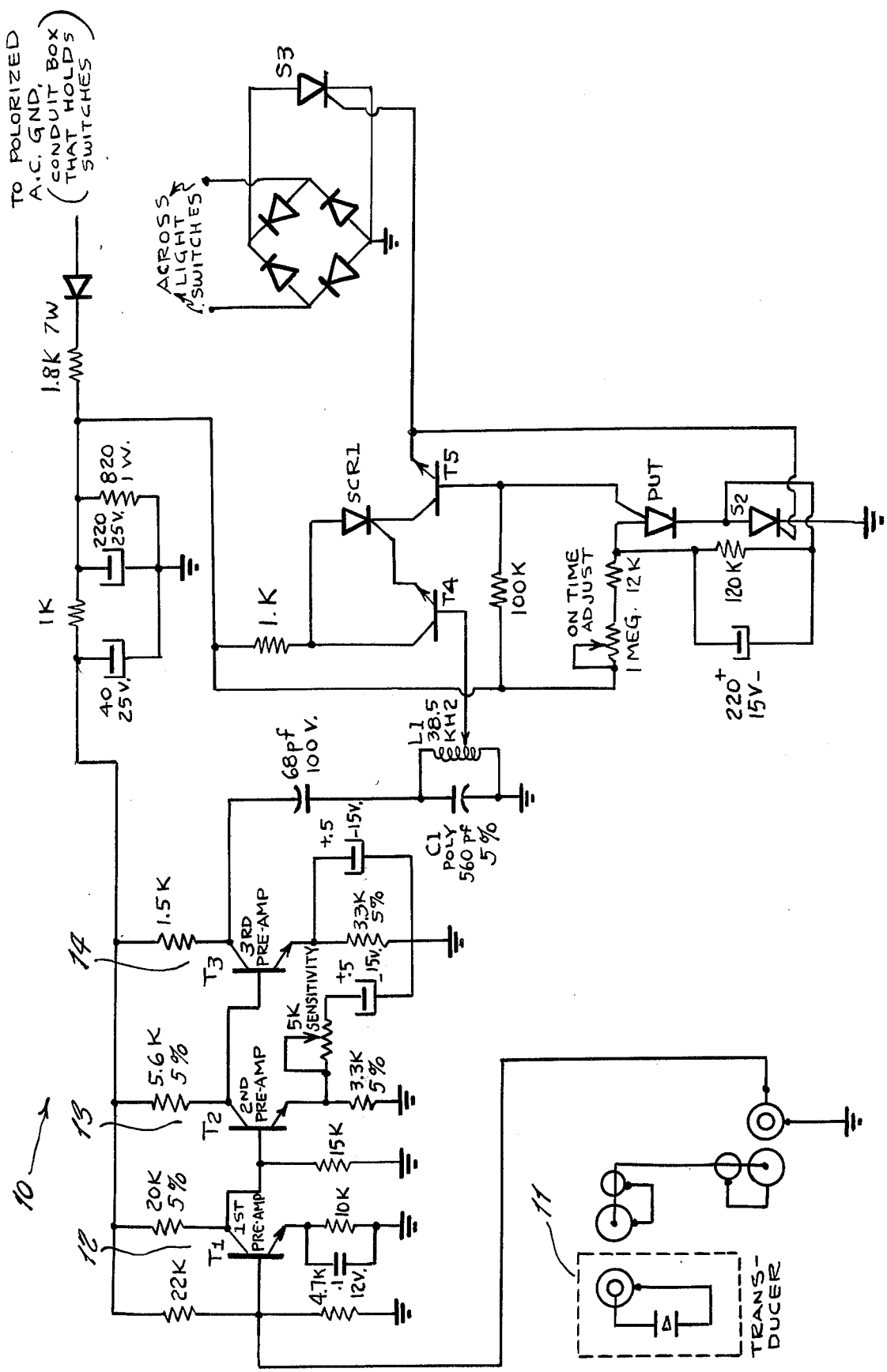

SENSALIGHT

This invention relates generally to household electrical circuits that are incorporated into the home for the convenience of the residents thereof.

A principal object of the present invention is to provide an electrical circuit which is activated by the sound waves of jingling keys by a person outside of a front door of the house, so that the activated circuit automatically then turns on a porch lamp light for the convenience of the person to more easily locate the door key hole.

Another object is to provide a sensalight electrical circuit which additionally can turn on other lights or appliances inside the house so that they will be already on when the person enters an otherwise darkened home during night time hours.

Still another object is to provide a sensalight electrical circuit which remains in an activated state for a selected length of time such as possibly for 1 minute, after which it automatically shuts off, by which time a person will have already turned on manually whatever lights or appliances he wishes to be on.

Yet another object is to provide a sensalight electrical circuit that can be triggered from 20 to 40 feet away distances.

Other objects are to provide a sensalight electrical circuit which is simple in design, inexpensive to manufacture, rugged in construction, easy to use and efficient in operation.

These and other objects will be readily apparent upon a study of the following specification and the accompanying drawing wherein:

The sole FIGURE in a diagram of the electrical circuit of the present invention.

Referring now to the drawing in greater detail, the reference numeral 10 represents a sensalight according to the present invention wherein there is a transducer 11 that is mounted next to a doorbell of a home. The transducer may be cylindrical in shape, be approximately ¾ inch in diameter and one inch in length, having a screened face on its exposed outer end, the transducer being mounted in the wall.

The transducer changes all frequencies of sound into electrical pulses; these pulses then being amplified through three stages 12, 13 and 14, as shown in the diagram.

This band of frequencies, thus produced, is then sent to ground through the C1 and L1, except the 38.5 KHZ (which is a frequency component of the jingle of the keys) which is passed (since C1 and L1 resonate at 38.5 KHZ) to the base of T4. T4, in its "on" state, will pulse the gate of SCR1 which latches on through T5 and supplies continuous gate to SCR3, thus turning on the lights.

T4 also supplies continuous gate to SCR2 which enables timing of the activated circuit.

When the PUT's anode voltage rises above its gate voltage, the PUT turns on, taking the base of T5 down, thus turning T5, SCR1, SCR2 and SCR3 together with the lights off.

In this design the maximum triggering distance varies between 20 to 40 feet. The one meg pot adjusts the on time of the lights.

Thus there is designed a sensalight that serves a useful purpose to home residents.

While various changes may be made in the detail construction, it is understood that such changes will be within the spirit and scope of the present invention as is defined by the appended claims.

What I claim is:

1. In an electrical circuit, the combination of means whereby a resident jingles his keys outside of his home, and said means turns on an outside light of said home so that said resident more easily finds a door key hole, and said means turns on lights or appliances inside said home, said means incorporating a transducer mounted next to a doorbell for receiving sound waves of said jingling keys and converting said sound waves into electrical pulses wherein said circuit includes three stages for (amplifying) said pulses and a capacitor and (inductor) through which all said frequency pulses, except 38.5 KHZ is sent to a ground of said circuit wherein the 38.5 KHZ frequency component is passed to a base of a transistor, T4 which pulses a gate of a (semiconductor,) SCR1 which latches on through transistor T5 and supplies continuous gate to a (semiconductor) SCR3 to turn on said lights and wherein said T4 transistor also supplies a continuous gate to (semiconductor) SCR2 for timing said circuit, said circuit further including a PUT device which turns on when its anode voltage rises above its gate voltage, thus taking the base of said T5 transistor down, and thus (turning) off said T5 transistor, (semiconductors) SCR1, SCR2, SCR3 and said lights.

* * * * *